US008097956B2

(12) United States Patent
von Kaenel (10) Patent No.: US 8,097,956 B2
(45) Date of Patent: Jan. 17, 2012

(54) FLEXIBLE PACKAGING FOR CHIP-ON-CHIP AND PACKAGE-ON-PACKAGE TECHNOLOGIES (75) Inventor: Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 30 days.

(21) Appl. No.: 12/402,633

(22) Filed: Mar. 12, 2009

(65) Prior Publication Data
US 2010/0230825 A1    Sep. 16, 2010

(51) Int. Cl.
*H01L 23/52*    (2006.01)
(52) U.S. Cl. ....................................................... 257/777
(58) Field of Classification Search .......... 257/600–699, 257/777
See application file for complete search history.

(56) References Cited

U.S. PATENT DOCUMENTS

| | | | |
|---|---|---|---|
| 5,347,428 A | 9/1994 | Carson et al. | |
| 5,583,749 A | 12/1996 | Tredennick et al. | |
| 5,973,403 A * | 10/1999 | Wark | 257/777 |
| 6,140,710 A | 10/2000 | Greenberg | |
| 6,339,254 B1 * | 1/2002 | Venkateshwaran et al. | 257/686 |
| 6,486,528 B1 | 11/2002 | Pedersen et al. | |
| 7,215,018 B2 | 5/2007 | Vindasius et al. | |
| 7,245,021 B2 | 7/2007 | Vindasius et al. | |
| 7,317,256 B2 | 1/2008 | Williams et al. | |
| 7,391,118 B2 * | 6/2008 | Tsai | 257/778 |
| 7,446,420 B1 | 11/2008 | Kim | |
| 2002/0043719 A1 | 4/2002 | Iwaya et al. | |
| 2002/0195697 A1 * | 12/2002 | Mess et al. | 257/686 |
| 2004/0012934 A1 | 1/2004 | Jafari et al. | |
| 2004/0036141 A1 | 2/2004 | Rakshani | |
| 2004/0119159 A1 | 6/2004 | Takahashi | |
| 2006/0071332 A1 | 4/2006 | Speers | |
| 2007/0096291 A1 | 5/2007 | Kawabata | |

(Continued)

FOREIGN PATENT DOCUMENTS
EP    1 657 746    5/2006

OTHER PUBLICATIONS
International Search Report from PCT/US2010/025948 mailed Jul. 1, 2010, 11 pages.

(Continued)

*Primary Examiner* — Ha Tran T Nguyen
*Assistant Examiner* — Shaun Campbell
(74) *Attorney, Agent, or Firm* — Lawrence J. Merkel; Meyertons, Hood, Kivlin, Kowert & Goetzel, P.C.

(57) ABSTRACT

In one embodiment, a packaging solution for an application integrated circuit (IC) and one or more other ICs is provided. The packaging solution may support both chip-on-chip packaging of the application IC (in flip-chip connection to a package substrate) and other ICs (in non-flip chip orientation), and package-on-package packaging of the application IC and the other ICs. The package substrate may include a first set of pads proximate to the application IC to support chip-on-chip connection to the other ICs. The pads may be connected to conductors that extend underneath the application IC, to connect to the application IC. A second set of pads may be connected to package pins for package-on-package solutions. If the chip-on-chip solution proves reliable, support for the package-on-package solution may be eliminated and the package substrate may be reduced in size.

14 Claims, 5 Drawing Sheets

U.S. PATENT DOCUMENTS

| | | |
|---|---|---|
| 2008/0079121 A1 | 4/2008 | Han |
| 2008/0136044 A1 | 6/2008 | Oh |
| 2008/0157393 A1 | 7/2008 | Kodama et al. |
| 2008/0185586 A1 | 8/2008 | Lin |
| 2008/0224279 A1 | 9/2008 | Caskey et al. |
| 2008/0252262 A1 | 10/2008 | Buhler et al. |
| 2008/0253085 A1 | 10/2008 | Soffer |
| 2008/0284716 A1 | 11/2008 | Edwards et al. |
| 2008/0290377 A1 | 11/2008 | Chang |
| 2008/0303131 A1 | 12/2008 | McElrea et al. |
| 2008/0303154 A1 | 12/2008 | Huang et al. |
| 2008/0315407 A1 | 12/2008 | Andrews et al. |
| 2008/0315434 A1 | 12/2008 | McElrea et al. |

OTHER PUBLICATIONS

Extended International Search Report from Application No. 10155547.2-2203 / 2228822, mailed Jun. 10, 2010, 17 pages.

Partial International Search Report from Application No. 10155547.2-2203, mailed Jun. 28, 2010, 5 pages.

KIPO's Notice of Preliminary Rejection (English Translation) in Korean Patent Application No. 10-2010-22244 issued Jun. 28, 2011.

Notification of First Action in Chinese Patent Application No. 201010135302.1 issued Aug. 5, 2011.

Examination Report in application No. EP 10155547.2 mailed Oct. 4, 2011.

Action in application No. JP2010-083649 issued Oct. 6, 2011.

English translation of Abstract of JP 2008-515202 which corresponds to WO2006/039254 and US2006/071332.

English translation of Abstract of JP 2004-146524 which corresponds to US200/40119159.

English translation of Abstract of JP 2005-064355 which corresponds to EP1657746 and US2007-262465.

English translation of Abstract of JP 2007-250935.

English translation of Abstract of JP 2008-299997.

* cited by examiner

FLEXIBLE PACKAGING FOR CHIP-ON-CHIP AND PACKAGE-ON-PACKAGE TECHNOLOGIES

BACKGROUND

1. Field of the Invention

This invention is related to the field of integrated circuits and, more particularly, to packaging of integrated circuits.

2. Description of the Related Art

Integrated circuit chips are generally packaged to provide more convenient and reliable connection to other components such as a circuit board, to protect the integrated circuit from damage, etc. Originally, each integrated circuit chip was housed in its own package, which was soldered or otherwise electrically and physically connected to a circuit board to which other integrated circuits (each in their own packages) and other electronic components were also connected.

More recently, package-on-package connections have been used to reduce the size of the device that includes the integrated circuits. In such cases, a first integrated circuit is packaged in a package that includes pins to connect to a circuit board and which also includes mounting points that match the pins of another integrated circuit. The other integrated circuit can be mounted on the first integrated circuit via the mounting points.

Another strategy that is beginning to be used is chip-on-chip packaging. In chip-on-chip packaging, multiple integrated circuit chips are stacked and are connected directly to each other (e.g. without an intervening package). In one chip-on-chip solution, the chips are stacked in the same orientation (i.e. "face up"). The largest chip in the stack is on the bottom, and connection is made from the top of the largest chip up the sides of the smaller chips, e.g. via wire bond loops that extend from the pads on the smaller chips over the side of the smaller chips. The stacked chips are included in a single package for connection to other components. The chip-on-chip package provides a smaller over-all volume than the package-on-package solution.

Each packaging solution has associated risks as well. Package-on-package technology carries more risk (e.g. in terms of parts that do not operate correctly and must be disposed of at manufacture, in terms of earlier failure due to defects not yet apparent in a newer technology, in terms of early failure of the part due to a single chip failure, etc.) than mounting each individual packaged circuit to a circuit board. Chip-on-chip packaging carries more risk than package-on-package technology as well. Thus, a product designer makes tradeoffs in risk and product goals when considering the packaging of components of the product.

SUMMARY

In one embodiment, a packaging solution for an application integrated circuit (IC) and one or more other ICs is provided. The packaging solution may support both chip-on-chip packaging of the application IC (in flip-chip connection to a package substrate) and other ICs (in non-flip chip orientation). The packaging solution may also support package-on-package packaging of the application IC and the other ICs. The package substrate may include a first set of pads proximate to the application IC to support chip-on-chip connection to the other ICs. The pads may be connected to conductors that extend underneath the application IC, to connect to the flip-chip-mounted application IC. A second set of pads may be connected to package pins for package-on-package solutions. If the chip-on-chip solution proves reliable, support for the package-on-package solution may be eliminated and the package substrate may be reduced in size.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

In one embodiment, a packaging solution may support chip-on-chip packaging and may also maintain support for package-on-package packaging for the same chips. The package-on-package implementation may be a proven technology (as compared to a chip-on-chip implementation), and thus its risk factor may be lower than the chip-on-chip implementation. The chip-on-chip implementation may have a higher risk factor, but may also reduce the size of the overall package. If the chip-on-chip implementation proves to be reliable, the support for the package-on-package solution may be removed and the package size may be reduced. On the other hand, if the chip-on-chip implementation proves unreliable, the same package may be used to package the integrated circuit at the bottom of the stack with separately-packaged instances of the other integrated circuits in a package-on-package solution. Accordingly, the packaging solution described herein may permit chip-on-chip packaging while offsetting the risk of chip-on-chip packaging by maintaining support for the package-on-package implementation using the same package substrate.

In some embodiments, the packaging solution may be used to support either packaging option. For example, the chip-on-chip implementation may be more expensive, and thus may be desirable for end products in which the expense can be justified. Other end products may not support the higher cost, but may be less sensitive to space and the package-on-package implementation may be used.

In an embodiment, the packaging solution may support flip chip attachment of the bottom integrated circuit, and the stacking of two or more integrated circuits on top of the bottom integrated circuit. The packaging solution may include a package substrate having conductors to connect to the flip-chip connections of the integrated circuit. The conductors may extend outward from underneath the integrated circuit, and may include a first set of pads near the side of the integrated circuit. These pads may be used to connect to the chips stacked on top of the integrated circuit. The conductors may extend further to a second set of pads which are provided to connect to package pins. The package pins may support the package-on-package portion of the packaging solution.

In an embodiment, the conductors may include two sets of conductors that connect to two physical layer interface circuits on the bottom integrated circuit. The two physical layer interface circuits may be physically located along two adjacent edges of the integrated circuit, and the corresponding pads for the two sets of conductors may be located near the two edges, respectively. The integrated circuit chips to be stacked on top may have pads on one edge of the integrated circuits, and may align to the pads on the package substrate. By stacking the integrated circuits with orthogonal orientation to each other, two independent sets of connections may be made.

For example, in one embodiment, the integrated circuit chips stacked on top may be memory integrated circuits such as dynamic random access memories (DRAMs), static RAMs (SRAMs), flash memory, etc. The physical layer interface circuits may be the physical layer for interfacing to the memories (e.g. driving address and control signals, and driving or receiving data signals depending on the operation). There may be respective memory controllers in the bottom integrated circuit (which is referred to herein as an application integrated circuit).

The application integrated circuit with stacked memory integrated circuits will be used below as an example. However, any set of integrated circuits may be used. In one embodiment, the application integrated circuit may have two or more integrated circuits stacked on top (e.g. the memory integrated circuits, or any other type of integrated circuit that may be connected to the application integrated circuit). The stacked integrated circuits may be of the same type as each other, and may be different from the application integrated circuit.

Figure 1:
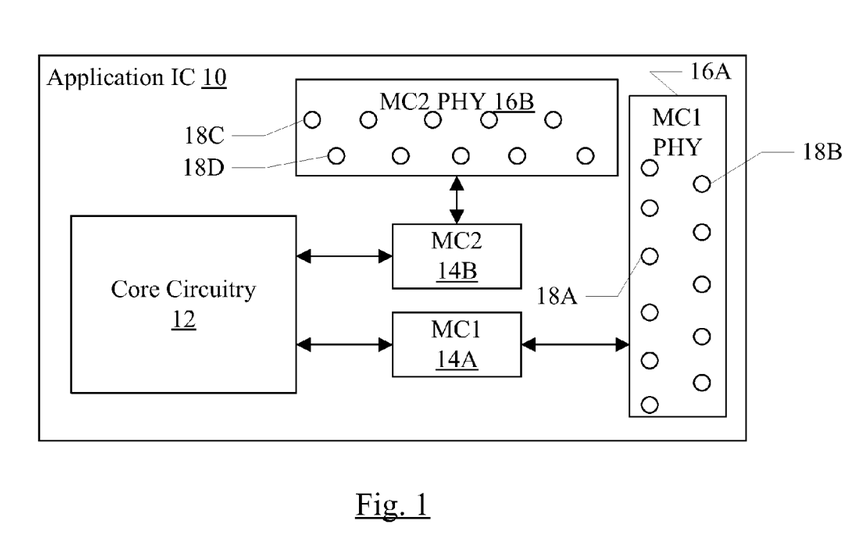
FIG. 1 is a block diagram illustrating one embodiment of an integrated circuit.

Turning now to FIG. 1, a block diagram of one embodiment of an application integrated circuit (IC) 10 is shown. In the illustrated embodiment, the application IC 10 includes core circuitry 12, memory controllers 14A-14B, and memory controller physical layer interface (PHY) circuits 16A-16B. The core circuitry 12 is coupled to the memory controllers 14A-14B, which are coupled to PHY circuits 16A-16B respectively, as shown in FIG. 1. Above the PHY circuits 16A-16B are controlled collapse chip connection (C4) bumps such as C4 bumps 18A-18B above the PHY circuit 16A and the C4 bumps 18C-18D above the PHY circuit 16B.

A physical layer interface circuit may generally include circuitry to communicate on the signal lines the form an interface. Generally, an interface may include a collection of signals driven and received on signal lines, along with the electrical requirements for driving/receiving the signals and the protocol for communications using the signals. For example, bus or packet protocols are often used on general purpose interfaces. Custom interfaces may be defined to communicate with specific types of chips or other devices (e.g. a memory interface for communicating with memory chips). The interface may have any definition and protocol, and communications on the signal lines as a whole implement the protocol and provide the communication. The physical layer interface circuit may implement at least the electrical requirements for driving and receiving the signals, including timing requirements. If line coding is used (e.g. 8b-10b encoding), the physical layer may also implement the coding and decoding.

The PHY circuits 16A-16B may be physical layer interface circuits for the memory interface. Thus, the PHY circuits 16A-16B are configured to communicate on the signals of the memory interface to the memory ICs to be stacked on the application IC 10 in the package (or to be connected in a package-on-package implementation, as described in more detail below).

The embodiment of FIG. 1 is intended to illustrate the physical location of the PHY circuits 16A-16B along edges of the application IC 10. The PHY circuits 16A-16B may not occupy the entire length of the edge, but are located along the edge. Specifically, the PHY circuits 16A-16B are located along adjacent edges of the application IC 10. The adjacent edges of an IC may be edges that terminate at a common point. Viewed in another way, the adjacent edges may be orthogonal to each other if a square or rectangular IC 10 is used. Thus, in FIG. 1, the left edge is adjacent to the top edge and the bottom edge, both of which are also adjacent to the right edge. The PHY circuits 16A-16B are located on the right edge and the top edge as shown in FIG. 1. However, left, right, top, and bottom are all relative to a particular viewpoint, in this case the orientation shown in FIG. 1.

In each case, the C4 bumps that connect the PHY circuits 16A-16B to the signal lines of the package are located above the corresponding PHY circuits 16A-16B. Thus, the C4 bumps corresponding to the two memory interfaces are located along adjacent edges as well. There are two rows of C4 bumps shown in FIG. 1, but any number of rows may be provided, in general, to provide connectivity for the memory interfaces. The C4 bumps may be applied to the top surface of the application IC 10 (the surface visible in FIG. 1), in contact with the last layer of metal in the application IC 10. The number of signals depends on the memory interface definition, and the may generally include the address lines, the control lines, and the data lines. The number of C4 bumps illustrated in the figures (and similarly the number of other pads as discussed in more detail below) is not intended to represent the entire number of signal lines.

The memory controllers 14A-14B and the core circuitry 12 may not necessarily be physically located as shown in FIG. 1. The memory controllers 14A-14B may be coupled to the respective PHY circuits 16A-16B, and may generally include the circuitry to interface to the core circuitry 12 to receive memory requests, queues to store the memory requests, circuitry to select requests to be transmitted, etc. The core circuitry 12 implements the operation for which the application IC 10 is designed. In general, an application IC may be designed for any set of operations. For example, in one embodiment, the application IC 10 may include one or more processor cores configured to execute instructions defined in an instruction set architecture. The application IC 10 may be a system on a chip (SOC), and may implement various peripheral circuits in addition to the processor cores (e.g. audio and/or video processing, graphics, direct memory access (DMA) engines, input/output bridge circuitry, etc.). The application IC 10 may be a fixed function integrated circuit that does not include processors, in other embodiments.

An integrated circuit may generally comprise any circuitry that is formed on a single semiconductor substrate. The substrate, with the circuitry formed thereon, is also referred to as a chip. The circuitry may be formed on one planar surface of the semiconductor substrate, by implanting impurities into the substrate near the planar surface and constructing layers of conductive materials such as aluminum, copper, polysilicon, etc. on the planar surface to form transistors and other components and to connect them together. Insulating layers are also applied to provide insulation between the conductive materials. The edges of the integrated circuit may be the areas near the periphery of the integrated circuit on the planar surface.

Figure 2:
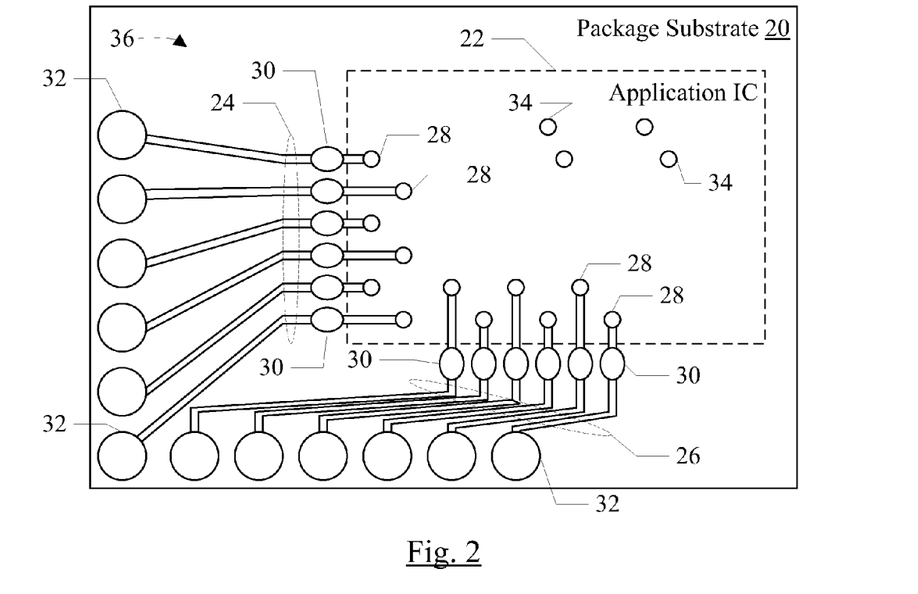
FIG. 2 is a block diagram of one embodiment of a package for the integrated circuit.

Turning now to FIG. 2, a block diagram of a portion of a package substrate 20 is shown. The package substrate 20, along with the package pins and potentially an encapsulating protective layer of plastic (or a metallic lid) may form the package of the application IC 10 (and the stacked ICs included in a chip-on-chip package, if applicable). The footprint of the application IC 10 on the package substrate 20 by the dotted box 22. While the footprint is shown to one side in FIG. 2 for convenience in the drawing, the package substrate 20 may actually extend an equal distance from each edge of the application IC 10, in some embodiments. The footprint may generally refer to the area of the package substrate 20 above which the application IC 10 will be located when mounted on the application IC 10. The footprint includes the endpoints to which the C4 bumps of the application IC 10 will be connected, in flip-chip mount embodiments.

The package substrate 20 includes sets of conductors that are arranged to connect to the C4 bumps on the application IC 10, when the application IC 10 is mounted to the package substrate 20 in flip chip orientation. The conductors 24, for example, may connect to the C4 bumps in the PHY circuit 16A and the conductors 26 may connect to the C4 bumps in the PHY circuit 16B. Because the C4 bumps are on the top surface of the application IC 10 and within the periphery of the application IC 10, the conductors 24 and 26 extend underneath the footprint of the application IC 10. Each conductor 24 and 26 includes an endpoint 28 the connects to the C4 bumps on the application IC 10. The endpoints 28 may be pads, as discussed below.

The conductors 24 and 26 extend from the endpoints 28 out from underneath the footprint of the application IC 10. Just outside the footprint of the application IC 10, a set of pads 30 are formed on the conductors 24 and 26. Thus the pads 30 are near (or proximate) two adjacent sides of the application IC 10. In some cases, the pads 30 may contact the footprint of the application IC 10, or may even extend slightly underneath the footprint. Because the pads 30 will be used to contact the conductors that connect to the stack ICs in a chip-on-chip mount, it is may be desirable for the pads 30 to be as close to the footprint as possible.

The conductors 24 and 26 extend further outward from the pads 30 to a second set of pads 32 on the package substrate 20. The pads 32 are dimensioned to connect to the package pins of the package. Specifically, the pads 32 an corresponding package pins are arranged to be connected to packaged ICs in the package-on-package configuration. In the illustrated embodiment, the package-on-package configuration includes pins near the edges of the top surface of the package substrate 20 (as viewed in FIG. 2). The pins may also be provided toward the interior of the top surface of the package substrate 20, depending on the size of the packaged ICs. Pins on other edges of the top surface of the package substrate 20 besides the edges shown in FIG. 2 may also be provided. Conductors 24 and 26 may be routed from the pads 30 to the other edges in such embodiments.

Accordingly, the package substrate 20 as shown in FIG. 2 supports both a chip-on-chip solution (using the pads 30) and a package-on-package solution (using the pads 32). The chip-on-chip solution may be validated using some number of initial parts, and if the technology proves reliable, the package substrate 20 (and thus the package size) may be reduced by removing the pads 32 and the conductors extending from the pads 30 to the pads 32, then reducing the size of the package substrate. If the chip-on-chip solution proves to be unreliable (e.g. yield of correctly operating parts is too low, the lifetime of the parts is too low, etc.), then the package substrate 20 already supports the more proven package-on-package solution and the package-on-package parts may be produced using the package substrate 20. Any debugging/modification of the package substrate 20 that may have been discovered/performed while the chip-on-chip solution was being validated is reflected in the package substrate 20 used for the package-on-package solution, and thus production may begin immediately with the same package substrate 20.

In addition to the end points 28 connected to the conductors 24 and 26, the package substrate 20 may further include other end points 34 to connect to other C4 bumps of the application IC 10. The signal lines associate with these C4 bumps may be for connection to other components that are not included in the chip-on-chip or package-on-package solutions that may be implemented with the application IC 10. That is, the connection of the application IC 10 to these other components may be through a circuit board or other conventional connection mechanism. The end points 32 may be coupled through various layers of the package substrate 20 to a bottom surface of the package substrate 20 (opposite the surface visible in FIG. 2). The package may include package pins at the bottom surface of the package substrate 20, for connection to the circuit board or other interconnect. The package pins at the bottom surface need not be the same as the package pins at the top surface, although in one embodiment the package pins are also solder balls, similar to the pins applied to the visible surface of the package substrate 20.

Thus, the package substrate 20 may include layers of conductors and layers of insulator to permit the connection of the end points 34 to the correct pins on the bottom surface of the package substrate 20. The number of layers in the package substrate 20 may vary based on the amount of wiring congestion encountered in connecting the C4 bumps to the correct pins, the current capacity needs for each conductor, etc. The package substrate 20 may be similar to printed circuit board technology, on a smaller scale. The conductive materials used in the package substrate 20 (including the conductors 24 and 26) may include one or more of copper, gold, aluminum, alloys of any of the preceding with each other and other materials, etc. The insulating layers may be made of any insulating materials (e.g., plastic, ceramic, etc.).

Generally, the top surface of the package substrate 20 as viewed in FIG. 2 may be covered by an insulating layer, indicated by reference numeral 36. The insulating layer may cover much of the conductors 24 and 26. However, openings are formed in the insulating layer 32 at the end points 28 and 34 and the pads 30 and 32. These openings permit electrical connection to the end points/pads. A pad may be a generally flat surface to which an electrical connection can be made. The pad may simply be the opening, or the opening may be filled with a conductive material such as any of the conductive materials noted above. The pad may be larger than the conductor (e.g. the conductors 24 and 26) to simplify the mechanical process of connecting to the pad.

The package pins, as used herein, may generally be any conductor that may be used to make an electrical and at least partially mechanical connection between the packaged integrated circuit and other components such as circuit boards. There are a variety of package pins that may be used, such as the aforementioned solder balls (and balls made of other conductive and mechanically stable materials). The package pins may also be relatively straight metal pins such as those used on a pin grid array (PGA), which may be soldered to other components or inserted into a socket. Other pins may not be straight (e.g. gull wing or J lead designs for surface mounting). The package pins may still further comprise conductive pads such as those used in a land grid array (LGA) package.

As mentioned previously, in this embodiment, the package substrate 20 is designed for a flip-chip mounting of the application IC 10. That is, the top surface of the IC 10 as shown in FIG. 1 faces the top surface of the package substrate 20, and the C4 bumps on the top surface make electrical connection the end points 28 and 34. Accordingly, if the application IC 10 were mounted to the package substrate 20 in FIG. 2, the back surface of the application IC 10 (the surface opposite the surface visible in FIG. 1) would be visible from the viewpoint of FIG. 2. The C4 bumps may be made of solder, although other alternatives include gold balls or molded studs, electrically conductive plastics, plated bumps, etc. Flip-chip mounting is in contrast to "face up" wire bonding techniques.

Figure 3:
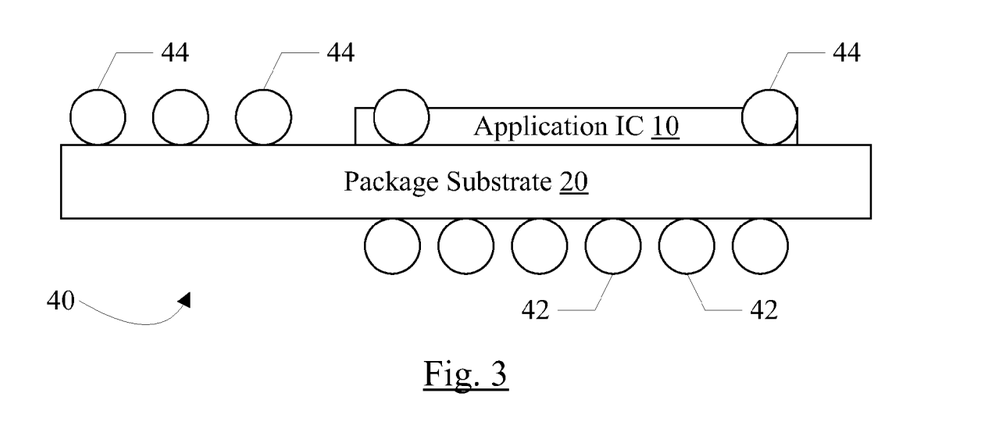
FIG. 3 is side view of one embodiment of the packaged integrated circuit.

FIG. 3 is a side view of one embodiment of the packaged application IC 10.

The package 40 in this embodiment includes the package substrate 20, package pins 42, and package pins 44 for package-on-package mounting. Other embodiments, e.g. if the chip-on-chip solution is considered reliable, may not include the package pins 44. The package pins 42 and 44 are both solder balls in this embodiment, but other embodiments may implement other pins for pins 42 and/or 44. To avoid obscuring the IC 10 in FIG. 3, not all of the package pins 44 are shown. The pins 44 may, in some embodiments, continue across the length of the package substrate 20 and/or around the surface area of the package substrate 20, as needed to meet the pin out of the packaged ICs to be attached to the pins 44 in a package-on-package configuration.

As illustrated in FIG. 3, the solder balls 44 are taller in height than the application IC 10, to support the package-on-package mounting. The difference in height may generally be sufficient to ensure that, after reflow of the solder balls to connect the other ICs (e.g. the memory ICs, in one embodiment), a solid mechanical and electrical connection may be made between the package 40 and the packages of the other ICs. In some embodiments, an adhesive material may be applied to the application IC 10 to help make the mechanical connection.

Not shown in FIG. 3, but optionally used in some embodiments, is a plastic encapsulant that may be applied to the top surface of the package substrate 20 and the application IC 10 attached to the top surface. The plastic encapsulant may protect the application IC 10 from damage. In such embodiments, the height of the solder balls 44 may be greater than the application IC 10 and the encapsulant.

The pins 42 may generally be arranged below the application IC 10 as illustrated in FIG. 3. In some embodiments, the pins 42 may extend beyond the footprint of the application IC 10, but may be centered around the footprint to permit the package substrate 20 to be reduced if the package-on-package option is later eliminated.

Figure 4:
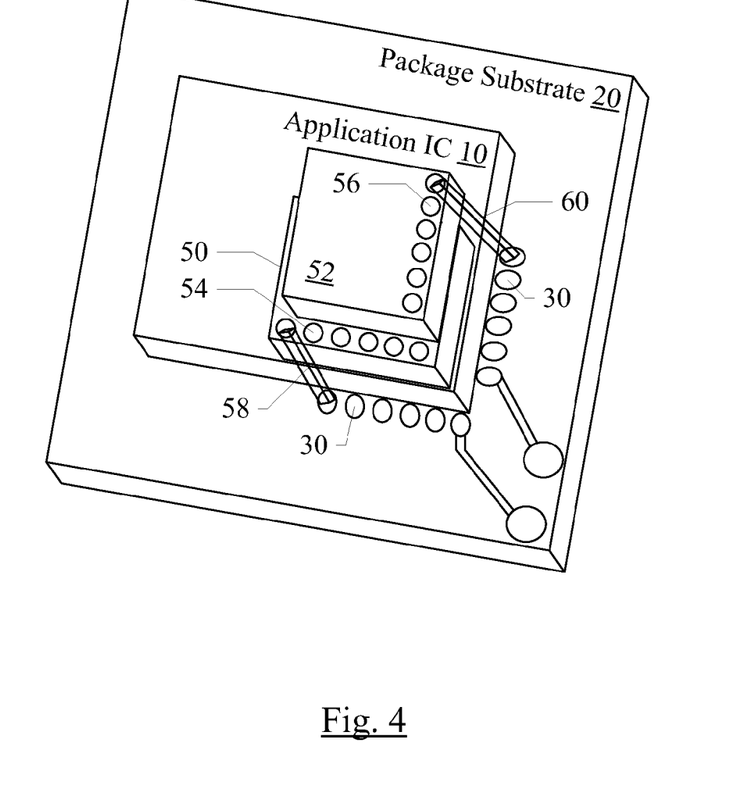
FIG. 4 is a block diagram of one embodiment of a chip-on-chip packaging of the integrated circuit and two other integrated circuits.

FIG. 4 illustrates a view of the package substrate 20 with the application IC 10 flip-chip mounted on the package substrate 20 and with two ICs 50 and 52 (e.g. memory ICs) stacked on the application IC 10. The ICs 50 and 52 may be stacked in "face up" orientation (e.g. the opposite of the flip-chip orientation of the application IC 10).

In the illustrated embodiment, the ICs 50 and 52 include respective pads 54 and 56 along one edge of the ICs 50 and 52. The pads 54 and 56 are arranged to align with the pads 30 on the package substrate 20, when the ICs 50 and 52 are stacked on the IC 10. This configuration may permit the chip-on-chip solution to be independent of the relative sizes of the IC 10 and the ICs 50 and 52. Such independence may be useful, in some embodiments (e.g. if the size of the IC 10 changes as the IC 10 is refined in design).

In the illustrated embodiment, the ICs 50 and 52 are stacked in an orthogonal orientation to each other. As used herein with respect to the orientation of ICs, the term orthogonal may general indicate that they are oriented approximately 90 degrees apart in the plane approximately parallel to the surfaces of the ICs 50 and 52 on which the circuitry of the ICs is formed (as well as the pads 54 and 56). The term orthogonal may generally include slight deviations from the 90 degree orientation due to mechanical tolerances, inaccuracies in placement, etc. Viewed in another way, the orthogonal orientation may be viewed as nominally 90 degrees, but permits variation in a particular instance since mechanical placement of the ICs is not perfect.

In the illustrated embodiment, the IC 52 is staggered on top of the IC 50, exposing the pads 54 for connection. Other embodiments may apply wire bond loops that extend outward from the pads 54, which may be used to make connection to the pads 30 and thus the staggered stacking may not be required.

With the ICs 50 and 52 stacked as illustrated in FIG. 4 (and held in place with an insulating adhesive layer between the ICs 50 and 52 and between the IC 50 and the application IC 10), conductors may be applied to connect the pads 30 to the pads 54 and 56, respectively. For example, a conductor 58 connects a pad 30 to a pad 54 on the IC 50, and a conductor 60 connects a pad 30 to a pad 56 on the IC 52. The conductor 58 or 60 may be connect to the pad 30, and may attach to the sides of the ICs 10, 50, and 52 as it rises above the surface of the package substrate 20 toward the corresponding pads 54 or 56. The conductor may then "bend over" to make electrical connection the corresponding pads 54 and 56 on the top surfaces of the ICs 50 and 52 as viewed from the perspective of FIG. 4. The conductors 58 and 60 may rise in a generally vertical direction from the planer surface of the package substrate 20 up the sides of the ICs 50 and 52, then horizontally to make connection to the pads 54 and 56.

The conductors 58 and 60 may be formed in any fashion. For example, the conductors 58 and 60 may be formed by spraying an electrically conductive epoxy from a suitable highly accurate spray device, such as the Axiom dispenser available from Asymtek (Carlsbad, Calif.). For example, the process may be similar to that used by Vertical Circuits, Inc. (Scotts Valley, Calif.).

It is noted that, while two ICs 50 and 52 are illustrated in FIG. 4, more ICs may be stacked on the IC 10 in other embodiments. For example, if the ICs 50 and 52 are memory ICs, additional memory ICs 50 and 52 may be stacked, alternating orientations between the orientation of the IC 50 and the IC 52. The ICs oriented in the same direction as the IC 50 may be connected to form a memory channel for one of the memory controllers 14A-14B. The ICs oriented in the same direction as the IC 50 may be connected to form a memory channel for the other memory controller 14A-14B. The memory channel may included ganging the memory ICs to provide a wider width of data transfer to/from the IC 10, interleaving the memory ICs to provide lower latency access, and/or banking the memory ICs.

If the more than two ICs are stacked, the stacking may include further staggering of the ICs similar to that shown in FIG. 4, to expose the pads on each IC for connection. For signal lines that are connected in parallel, the conductors 58 and 60 may connect to the pads 54 and 56, respectively, and then may continue horizontally across the top surfaces of the ICs 50 and 52 (respectively), on top of the insulating adhesive to avoid electrical connect to the top surface of the ICs, then vertically up the sides of the stacked ICs to the next pads. Alternatively, if the wire bond loops are used, the stacks may not be staggered as mentioned previously. For non-parallel signal lines, the conductors may be formed in a similar fashion but the insulating adhesive may be used to avoid connection to a pad on a lower IC in the stack.

In some embodiments, an encapsulant (e.g. plastic) may be applied to the top surface of the package substrate 20, the application IC 10, the ICs 50 and 52, and the conductors 58 and 60 to protect the assembly from damage. It is noted that each pad 30 may be connected to a respective pad 54 or 56 via a conductor 58 or 60. Not all conductors 58 and 60 are illustrated in FIG. 4 for simplicity in the drawing.

Figure 5:
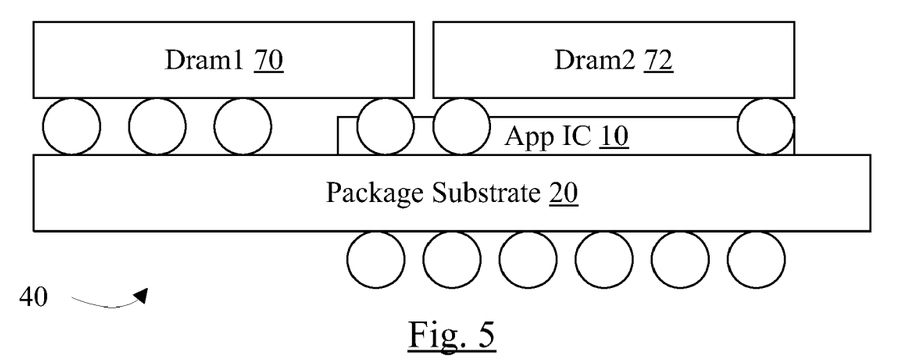
FIG. 5 is a block diagram of one embodiment of a package-on-package packaging of the integrated circuit and two other integrated circuits.

FIG. 5 is a side view of the packaged application IC 10, in the package 40 as illustrated in FIG. 3, with additional packaged memory ICs 70 and 72 in a package-on-package solution. In this case, the memory ICs 70 and 72 are DRAMs, but other embodiments may implement any memory ICs. Still further, other ICs may be used that are not memory ICs.

Figure 6:
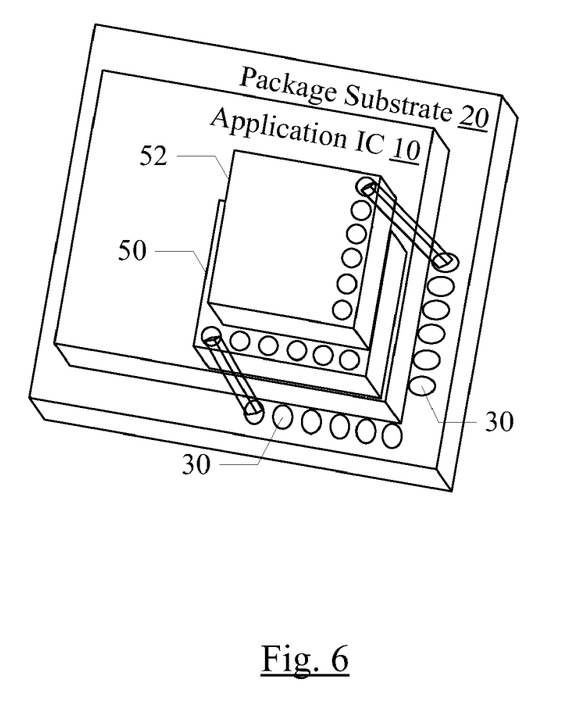
FIG. 6 is a block diagram of a second embodiment of the chip-on-chip packaging of the integrated circuit and two other integrated circuits.

FIG. 6 illustrates an embodiment in which the package substrate 20 has been reduced, eliminating support for the package-on-package solution. The reduction may be performed, e.g., if the chip-on-chip solution is judged reliable enough to eliminate the package-on-package solution. In the illustrated embodiment, the package substrate 20 is reduced to a size that supports that pads 30. In other embodiments, the pins 42 on the bottom of the package substrate 20 may be the factor that controls the amount or reduction. That is, the package substrate 20 may be reduced as much as possible while still supporting the pins 42 on the bottom of the package substrate 20 and the pads 30 on the top of the package substrate 20.

Figure 7:
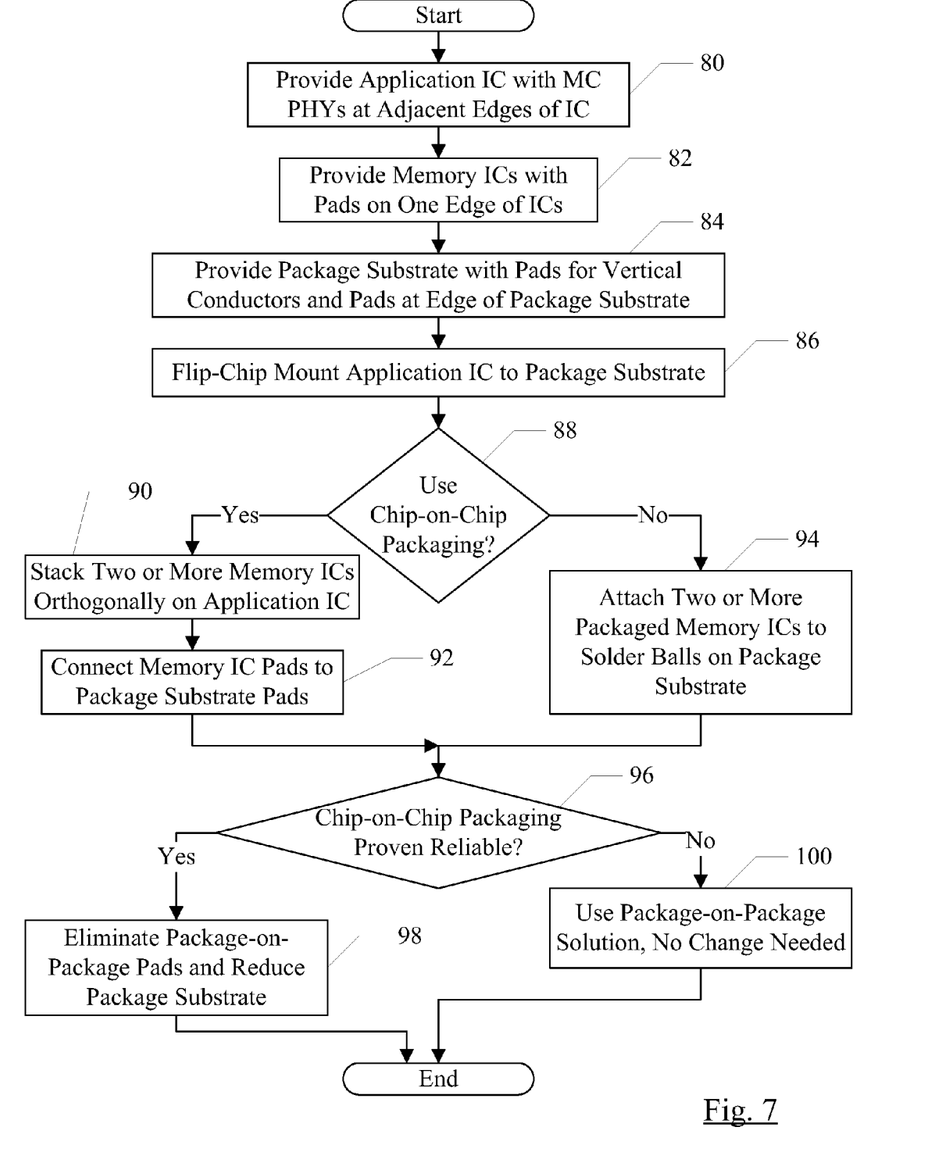
FIG. 7 is a flowchart illustrating one embodiment of packaging the integrated circuit.

FIG. 7 is a flowchart illustrating one embodiment of packaging the application IC 10 using the packaging solutions described above. While the blocks are shown in a particular order for ease of understanding, other orders may be used. Blocks may be performed in parallel as well. The flowchart in FIG. 7 illustrates the creation of one packaged IC 10, and may be repeated to produce additional packaged ICs 10.

An application IC may be provided that has the memory controller PHY circuits at adjacent edges of the application IC (block 80). For example, an application IC 10 similar to that shown in FIG. 1 may be provided. Additionally, memory ICs may be provided that include pads along one edge of the IC (block 82). For example, memory ICs with pads similar to ICs 50 and 52 may be provided. Memory IC vendors may design their ICs with a redistribution layer that can be customized for a desired pin out. The memory IC vendors may be instructed to customize the redistribution layer to provide the pads along one edge. A package substrate may be provided that includes pads for vertical conductors for chip-on-chip packaging and that also includes pads for solder balls or other package pins for package-on-package packaging (block 84). For example, a package substrate similar package substrate 20 shown in FIG. 2 may be provided. The application IC may be flip-chip mounted to the package substrate (block 86).

If the application IC is to be packaged with memory ICs using chip-on-chip packaging (decision block 88, "yes" leg), two or more of the memory ICs (without packaging) may be stacked orthogonally on the application IC (block 90). The memory ICs may be connected to the pads on the package substrate that are near the sides of the application IC (block 92). If chip-on-chip packaging is not selected (decision block 88, "no" leg), two or more packaged memory ICs may be attached to the solder balls on the top of the package substrate for a package-on-package solution (block 94).

After accumulating statistics of the reliability of the chip-on-chip solution, the method may include determining if the chip-on-chip packaging is reliable (decision block 96). The determination of reliability may be made based on any thresholds of the measurable statistics, in various embodiments. If chip-on-chip packaging is determined to be reliable (decision block 96, "yes" leg), the package substrate design may be modified to remove the pads for the package-on-package solution and shrink the package substrate dependent on the package pins and the pads for the chip-on-chip solution (block 98). If the chip-on-chip packaging does not provide to be reliable enough (decision block 96, "no" leg), the package-on-package solution may be used without any modification to the existing package substrate (block 100).

Figure 8:
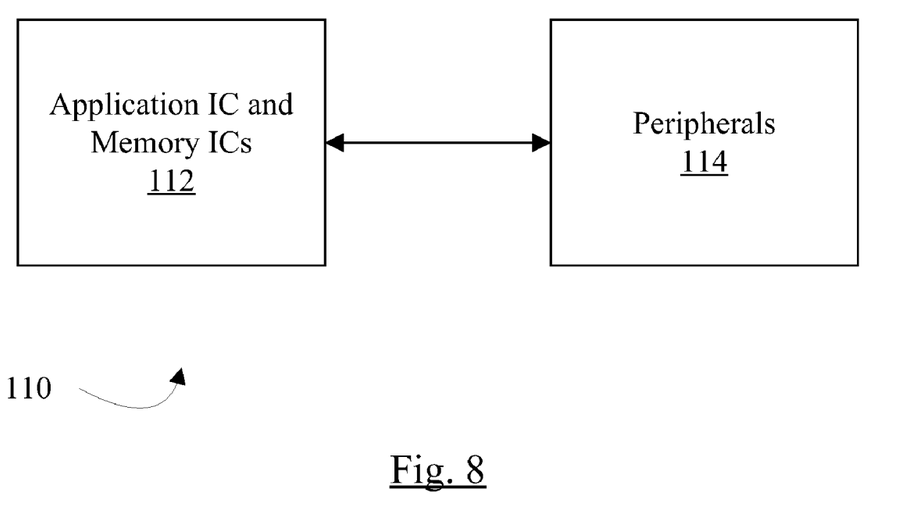
FIG. 8 is a block diagram of one embodiment of a system.

Turning now to FIG. 8, a block diagram of one embodiment of a system 110 is shown. In the illustrated embodiment, the system 110 includes at least one instance 112 of the application IC 10 and the memory ICs 50 and 52 (either in the chip-on-chip package or the package-on-package package) coupled to one or more peripherals 114. In some embodiments, more than one instance of the application IC and the memory ICs may be included.

The peripherals 114 may include any desired circuitry, depending on the type of system 110. For example, in one embodiment, the system 110 may be a mobile device and the peripherals 114 may include devices for various types of wireless communication, such as wifi, Bluetooth, cellular, global position system, etc. The peripherals 114 may also include additional storage, including RAM storage, solid state storage, or disk storage. The peripherals 114 may include user interface devices such as a display screen, including touch display screens or multitouch display screens, keyboard or other keys, microphones, speakers, etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a first physical layer interface circuit corresponding to a first interface by which the integrated circuit is configured to communicate external to the integrated circuit, wherein the first physical layer interface circuit comprises circuitry to communicate on each conductor that forms the first interface, and wherein the first physical layer interface circuit is physically located along a first edge of the integrated circuit; and
a second physical layer interface circuit corresponding to a second interface by which the integrated circuit is configured to communicate external to the integrated circuit, wherein the second physical layer interface circuit comprises circuitry to communicate on each conductor that forms the second interface, and wherein the second physical layer interface circuit is physically located along a second edge of the integrated circuit, wherein the second edge is adjacent to the first edge.

2. The integrated circuit as recited in claim 1 wherein the first interface and the second interface are instances of a same interface.

3. The integrated circuit as recited in claim 2 wherein the same interface is a memory interface to connect to one or more memory integrated circuits, and wherein the integrated circuit comprises a first memory controller coupled to the first physical layer interface circuit and a second memory controller coupled to the second physical layer interface circuit.

4. The integrated circuit as recited in claim 1 further comprising a first plurality of controlled collapse chip connection bumps arranged above the first physical layer interface circuit and a second plurality of controlled collapse chip connection bumps arranged above the second physical layer interface circuit, wherein the first plurality of controlled collapse chip connection bumps and the second plurality of controlled collapse chip connect bumps provide a flip chip connection to a package of the integrated circuit for the first interface and the second interface.

5. The integrated circuit as recited in claim 4 wherein the first plurality of controlled collapse chip connection bumps are arranged in one or more first rows, and wherein the second plurality of controlled collapse chip connection bumps are arranged in one or more second rows that are orthogonal to the one or more first rows.

6. A package for an integrated circuit, the package comprising:
a package substrate comprising a first plurality of conductors and an insulating layer that forms a first surface of the package substrate, wherein each of the first plurality of conductors comprises a first endpoint, wherein the first endpoints are arranged to connect to the integrated circuit in a flip chip configuration when the integrated circuit is mounted to the package substrate, and wherein the insulating layer comprises an opening for each first endpoint; and
wherein each of the first plurality of conductors extends to a respective first pad on the first surface of the package substrate to which a package pin connection is to be made; and
wherein each of the first plurality of conductors include a respective second pad proximate a first side of the integrated circuit when the integrated circuit is mounted on the package substrate, and wherein the insulating layer includes an opening for each respective second pad;
a first set of package pins attached to the respective first pads, wherein the first set of package pins collectively provide a mounting point for one or more packaged integrated circuits in a package-on-package configuration;
a second set of package pins attached to a second surface of the package substrate that is opposite the first surface, wherein the second set of package points provide for connection to a circuit board; and
a second set of endpoints on the first surface, each of the second set of endpoints connected to a respective pin of the second set of package pins through the package substrate, and the second set of endpoints arranged to connect to the integrated circuit separate from the first end points.

7. The package as recited in claim 6 wherein:
the package substrate further comprises a second plurality of conductors, wherein each of the second plurality of conductors comprises the first endpoint arranged to connect to the integrated circuit in the flip chip configuration when the integrated circuit is mounted to the package substrate, and wherein the insulating layer comprises an opening for each first endpoint; and
wherein each of the second plurality of conductors extends to the respective first pad on the first surface of the package substrate to which the package pin connection is to be made; and
wherein each of the second plurality of conductors include a respective third pad proximate a second side of the integrated circuit when the integrated circuit is mounted on the package substrate, and wherein the second side is orthogonal to the first side and wherein the insulating layer includes an opening for each respective third pad.

8. The package as recited in claim 6 wherein the package pins are solder balls.

9. A component comprising:
a package substrate;
a first integrated circuit flip-chip mounted to the package substrate, wherein the first integrated circuit comprises a first memory physical layer interface circuit and a second memory physical layer interface circuit, and wherein the package substrate comprises a first plurality of pads proximate a first side of the first integrated circuit and a second plurality of pads proximate a second side of the first integrated circuit, wherein the first plurality of pads are connected to a first plurality of connections on the first integrated circuit to which the first memory physical layer interface circuit is connected when the first integrated circuit is flip-chip mounted to the package substrate, and wherein the second plurality of pads are connected to a second plurality of connections on the first integrated circuit to which the second memory physical layer interface circuit is connected when the first integrated circuit is flip-chip mounted to the package substrate, and wherein the first plurality of connections form a first memory interface and the second plurality of connections form a second memory interface;
a second integrated circuit having a third plurality of pads along an edge of the second integrated circuit, the second integrated circuit stacked on the first integrated circuit with the third plurality of pads aligned to the first plurality of pads;
a third integrated circuit having a fourth plurality of pads along an edge of the third integrated circuit, the third integrated circuit stacked on the second integrated circuit in an orthogonal orientation to the second integrated circuit and with the fourth plurality of pads aligned to the second plurality of pads, wherein the second and third integrated circuits are memory integrated circuits; and a plurality of conductors connecting each of the first plurality of pads to the respective ones of the third plurality of pads and each of the second plurality of pads to the respective one of the fourth plurality of pads, whereby the second integrated circuit is connected to the first memory interface and the third integrated circuit is connected to the second memory interface.

10. The component as recited in claim 9 wherein the second integrated circuit and the third integrated circuit are mounted in a non-flip-chip orientation.

11. The component as recited in claim 9 wherein the third integrated circuit is offset from the second integrated circuit to expose the third plurality of pads.

12. The component as recited in claim 9 wherein the first further comprises a first memory controller coupled to the first memory physical layer interface circuit and a second memory controller coupled to the second memory physical layer interface circuit.

13. The component as recited in claim 9 wherein the first plurality of pads and the second plurality of pads are further connected to respective ones of a fifth plurality of pads that are connected to a plurality of package pins.

14. The component as recited in claim 13 wherein the plurality of package pins are each a solder ball.

* * * * *